(12) United States Patent
Hung et al.

(10) Patent No.: US 10,256,146 B2
(45) Date of Patent: Apr. 9, 2019

(54) METHOD OF FORMING SEMICONDUCTOR DEVICE

(71) Applicant: UNITED MICROELECTRONICS CORP., Hsin-Chu (TW)

(72) Inventors: Yu-Hsiang Hung, Tainan (TW); Ssu-I Fu, Kaohsiung (TW); Chao-Hung Lin, Changhua County (TW); Chih-Kai Hsu, Tainan (TW); Jyh-Shyang Jenq, Pingtung County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 62 days.

(21) Appl. No.: 15/871,037

(22) Filed: Jan. 14, 2018

(65) Prior Publication Data
US 2018/0138088 A1  May 17, 2018

Related U.S. Application Data

(62) Division of application No. 15/014,034, filed on Feb. 3, 2016, now Pat. No. 9,905,464.

(30) Foreign Application Priority Data

Jan. 5, 2016  (TW) .............................. 105100108 A

(51) Int. Cl.
*H01L 21/76* (2006.01)
*H01L 23/535* (2006.01)
(Continued)

(52) U.S. Cl.
CPC .... *H01L 21/76897* (2013.01); *H01L 21/0332* (2013.01); *H01L 21/0335* (2013.01);
(Continued)

(58) Field of Classification Search
CPC ............ H01L 21/0332; H01L 21/0335; H01L 21/0337; H01L 21/0338; H01L 21/76897;
(Continued)

(56) References Cited

U.S. PATENT DOCUMENTS 7,115,525 B2   10/2006  Abatchev et al.
2008/0277725 A1  11/2008  Shino
(Continued)

OTHER PUBLICATIONS

Hung, Title of Invention: Method of Forming Semiconductor Structure Having Contact Plug, U.S. Appl. No. 13/740,289, filed Jan. 14, 2013.

*Primary Examiner* — Ori Nadav
*Assistant Examiner* — Vernon P Webb
(74) *Attorney, Agent, or Firm* — Winston Hsu

(57) ABSTRACT

A semiconductor device and method of forming the same, the semiconductor device includes a first and second fin shaped structures, a first and second gate structures and a first and second plugs. The first and second fin shaped structures are disposed on a first region and a second region of a substrate and the first and second gate structure are disposed across the first and second fin shaped structures, respectively. A dielectric layer is disposed on the substrate, covering the first and second gate structure. The first and second plugs are disposed in the dielectric layer, wherein the first plug is electrically connected first source/drain regions adjacent to the first gate structure and contacts sidewalls of the first gate structure, and the second plug is electrically connected to second source/drain regions adjacent to the second gate structure and not contacting sidewalls of the second gate structure.

12 Claims, 17 Drawing Sheets

(51) Int. Cl.
*H01L 27/11* (2006.01)
*H01L 21/768* (2006.01)
*H01L 21/033* (2006.01)
*H01L 21/8234* (2006.01)
*H01L 29/06* (2006.01)
*H01L 29/08* (2006.01)
*H01L 29/66* (2006.01)
*H01L 29/78* (2006.01)
*H01L 49/02* (2006.01)

(52) U.S. Cl.
CPC ...... *H01L 21/0337* (2013.01); *H01L 21/0338* (2013.01); *H01L 21/76816* (2013.01); *H01L 21/76895* (2013.01); *H01L 21/823418* (2013.01); *H01L 21/823431* (2013.01); *H01L 21/823475* (2013.01); *H01L 21/823481* (2013.01); *H01L 23/535* (2013.01); *H01L 27/1104* (2013.01); *H01L 27/1116* (2013.01); *H01L 28/00* (2013.01); *H01L 29/0653* (2013.01); *H01L 29/0847* (2013.01); *H01L 29/66545* (2013.01); *H01L 29/7851* (2013.01)

(58) Field of Classification Search
CPC ... H01L 21/82; H01L 23/535; H01L 27/1104; H01L 27/1116
USPC .......................................... 257/390–394, 401
See application file for complete search history.

(56) References Cited

U.S. PATENT DOCUMENTS

2009/0108314 A1    4/2009  Cai
2014/0256136 A1*   9/2014  Tsai ................. H01L 29/66795
                                                            438/696
2016/0218010 A1*   7/2016  Lee .................. H01L 21/28132

* cited by examiner

METHOD OF FORMING SEMICONDUCTOR DEVICE

CROSS REFERENCE TO RELATED APPLICATIONS

This application is a Divisional of application Ser. No. 15/014,034 filed Feb. 3, 2016, and included herein by reference.

BACKGROUND OF THE INVENTION

1. Field of the Invention

The present invention relates to a semiconductor device and a method of forming the same, and more particularly to a semiconductor device having a plug structure and a method of forming the same.

2. Description of the Prior Art

In recent years, the critical dimension (CD) in semiconductor processes becomes finer with the increasing miniaturization of semiconductor devices. However, as the CD of the semiconductor device is shrunk continuously, the integrated process of forming a semiconductor device having metal gate also faces more challenges and limitations.

As the semiconductor industry has progressed into nanometer technology process nodes in pursuit of highly integrated and high-speed operation, current techniques utilize miniaturized through holes and inter-layer dielectric layers to form a multilayered interconnected wiring structure to electrically connect a metal gate and source/drain regions of a transistor, thereby providing signal input/output pathways for the transistor. However, the current photoresist and lithography techniques are no longer qualified enough to support the currently integrated process while forming the metal gate and contact plug. For example, the position shift of the contact plug electrically connected to the source/drain regions easily occurs, and which may directly penetrate the metal gate, thereby affecting the electrical performance of the entire device. For these reasons, how to efficiently improve the current structure of the semiconductor device, as well as the method of forming the same, has become an important task in this field.

SUMMARY OF THE INVENTION

It is one of the primary objectives of the present invention to provide a semiconductor device having a plug structure and a method of forming the same, wherein the method includes utilizing a spacer self-aligned double patterning (SADP) process to transfer patterns in a dense region to form a contact plug in the dense region. Through such performance, the present invention may enable to form fin shaped structure in precise arrangement, thereby improving the electrical performance of the entire semiconductor structure.

To achieve the purpose described above, the present invention provides a semiconductor device including a first fin shaped structure and a second fin shaped structure, a first gate structure and a second gate structure, a dielectric layer and a first plug and a second plug. The first and the second fin shaped structures are disposed on a substrate within a first region and a second region respectively, and the first and the second gate structures are disposed across the first and the second fin shaped structures respectively. The dielectric layer is disposed on the substrate to cover the first and the second gate structures. The first plug is disposed in the dielectric layer and the first plug is electrically connected to first source/drain regions disposed at two sides of the first gate structure and contacts sidewalls of the first gate structure. The second plug is disposed in the dielectric layer and the second plug is electrically connected to second source/drain regions disposed at two sides of the second gate structure and does not contact sidewalls of the second gate structure.

To achieve the purpose described above, the present invention provides a method of forming a semiconductor device including following steps. First of all, a substrate is provided and the substrate has a first fin shaped structure in a first region and a second fin shaped structure in a second region. Then, a first gate structure is formed to across the first fin shaped structure and a second gate structure is formed to across the second fin shaped structure. Next, a dielectric layer is formed on the substrate to cover the first gate structure and the second gate structure. Following these, a mask layer is formed on the dielectric layer in which the mask layer includes a quad-layer structure and the quad-layer structure includes materials in different etching selectivity alternately stacked with each other. Then, a first pattern is formed in the mask layer in the first region through a sidewall image transferring process. Next, a patterned hard mask layer is formed on the mask layer, in the second region. Afterward, the patterned hard mask layer is used to form a second pattern in the mask layer in the second region. Finally, a portion of the dielectric layer in the first region is removed by using the first pattern as a mask, to form a first opening exposing sidewalls of the first gate structure, and a portion of the dielectric layer in the second region is removed by using the second pattern as a mask, to form a second opening.

According to above, the method in the present invention is characterized by using the spacer self-aligned double patterning process and the patterned mask layer respectively to transfer the patterns formed in the dense region and the iso region, thereby forming openings connected to source/drain regions in the dense region and the iso region. In this manner, the present invention may be able to form the fin shaped structures in precise layout and to improve the electrical performance of the entire device.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 17 are schematic diagrams illustrating a method of forming a semiconductor device according to a preferred embodiment of the present invention, in which:

FIG. 1 shows a schematic cross-sectional view of a semiconductor device at the beginning of the forming method;

FIG. 2 shows a schematic cross-sectional view of a semiconductor device after forming a mandrel;

FIG. 3 shows a schematic cross-sectional view of a semiconductor device after forming a spacer;

FIG. 4 shows a schematic cross-sectional view of a semiconductor device after forming a patterned mask layer;

FIG. 5 shows a schematic top view of a semiconductor device after forming an opening pattern;

FIG. 6 shows a cross-sectional view taken along a cross line A-A' in FIG. 5;

FIG. 7 shows a schematic cross-sectional view of a semiconductor device after forming another patterned mask layer;

FIG. 8 shows a schematic top view of a semiconductor device after forming a plurality of opening patterns;

FIG. 9 shows a cross-sectional view taken along a cross line B-B' in FIG. 8;

FIG. 10 shows a schematic top view of a semiconductor device after forming a blocking layer;

FIG. 11 shows a cross-sectional view taken along a cross line C-C' in FIG. 10;

FIG. 12 shows a schematic top view of a semiconductor device after forming a plurality of opening patterns;

FIG. 13 shows a cross-sectional view taken along a cross line D-D' in FIG. 12;

FIG. 14 shows a schematic top view of a semiconductor device after forming a plurality of openings;

FIG. 15 shows a schematic top view of a semiconductor device after forming another patterned mask layer;

FIG. 16 shows a schematic top view of a semiconductor device after forming an opening; and FIG. 17 shows a schematic top view of a semiconductor device after forming a plurality of contact plugs.

DETAILED DESCRIPTION

To provide a better understanding of the present invention, preferred embodiments will be described in detail. The preferred embodiments of the present invention are illustrated in the accompanying drawings with numbered elements.

Figure 1:
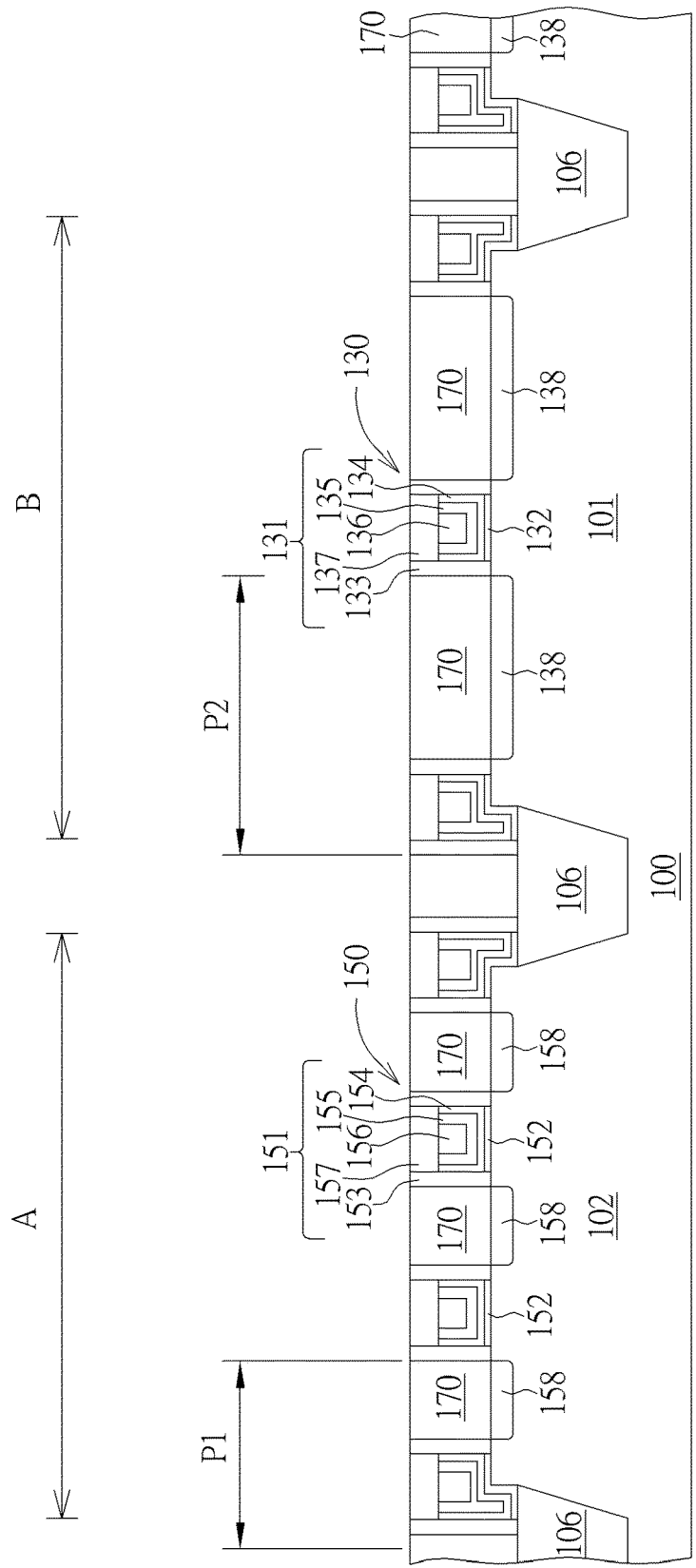

Please refer to FIG. 1 to FIG. 17, which schematically illustrate a method of forming a semiconductor device in accordance with the preferred embodiment of the present invention in which FIGS. 5, 8, 10 and 12 show schematic top views illustrating a semiconductor device in forming processes, and FIGS. 6, 9, 11 and 13 show cross-sectional views taken along the cross lines A-A', B-B', C-C' and D-D' in FIGS. 5, 8, 10 and 12 respectively. Firstly, as shown in FIG. 1, a substrate 100 is provided and which may include a semiconductor substrate such as a silicon substrate, an epitaxial silicon substrate or a silicon-on-insulator (SOI) substrate, or a non-semiconductor substrate such as a glass substrate, but is not limited thereto. The substrate 100 includes at least one dense region A such as a static random access memory (SRAM) region or a logic region formed thereon, and at least one iso region B such as a non-SRAM region, but is not limited thereto.

In one embodiment of the present invention, fin shaped structures 101, 102 may be formed on the substrate 100 within the dense region A and the iso region B respectively. The method of forming the fin shaped structures 101, 102 for example includes forming a patterned mask (not shown in the drawings) on the substrate 100, transferring a pattern of the patterned mask to the substrate 100 through an etching process, removing the patterned mask to form a plurality of trenches (not shown in the drawings) in the substrate 100, and finally forming an insulating layer 106 filled in the trenches. Accordingly, a portion of the substrate 100 may protrude from the insulating layer 106 to form the fin shaped structures 101, 102 and the insulating layer 106 may form shallow trench isolations (STIs) as shown in FIG. 1. However, in another embodiment of the present invention, the fin shaped structure may be omitted and the shallow trench isolations may also be formed on a planar substrate directly to define at least one active area, or the fin shaped structures may also be formed on a SOI substrate to omit the shallow trench isolations.

Next, a plurality of metal gate structures 130, 150 and an interlayer dielectric (ILD) layer 170 are formed on the substrate 100, and two source/drain regions 138, 158 are formed at two sides of the metal gate structures 130, 150 in the fin shaped structures 101, 102 (or the substrate 100) respectively. Specifically, the metal gate structures 130, 150 are formed across the fin shaped structures 101, 102 and preferably have different pitches P1, P2 respectively as shown in FIG. 1. In one embodiment, the formation of the metal gate structures 130, 150 may include following steps. Firstly, an interfacial layer (not shown in the drawings), a high-k gate dielectric layer 132, 152 for example including a high dielectric constant (high-k) material greater than 4 like hafnium oxide ($HfO_2$), a dummy gate structure (not shown in the drawings) and spacers 133, 153 are respectively formed on the substrate 100 within the dense region A and the iso region B. The source/drain regions 138, 158 are then formed at two sides of the dummy gate structures in the fin shaped structures 101, 102. Then, an interlayer dielectric material layer (not shown in the drawings) is formed on the entire substrate 100, and a planarization process such as a chemical mechanical polishing/planarization (CMP) process, an etching process or a combination of both is performed to remove a portion of the interlayer dielectric material layer till exposing the dummy gate structures, and a portion of the dummy gate structures are further removed to form trenches (not shown in the drawings). Afterwards, a work function metal material (not shown in the drawings) for example a P type work function metal layer including nitrides of nickel (Ni), tungsten (W), molybdenum (Mo), tantalum (Ta) or titanium (Ti) or a N type work function metal layer including titanium aluminide (TiAl), aluminum zirconium (ZrAl), aluminum tungsten (WAl), aluminum tantalum (TaAl) or aluminum hafnium (HfAl), a barrier material layer (not shown in the drawings) such as Ti/titanium nitride (TiN) or Ta/tantalum nitride (TaN) and a metal material layer (not shown in the drawings) such as tungsten or aluminum (Al) are sequentially formed to fill in the trenches. Following these, A CMP process is carried out to remove a portion of the work function metal material layer, a portion of the barrier material layer and a portion of the metal material layer outside the trenches, and an etching back process is carried out to partially remove the work function metal material layer, the barrier material layer and the metal material layer not filled in the trenches. This forms the work function metal layers 134, 154, barrier layers 135, 155, metal layers 136, 156 and the ILD layer 170 shown in FIG. 1. Finally, capping layers 137, 157 such as a silicon nitride (SiN) layer may be formed to fill the trenches. At this stage, the interlayer dielectric layer 170 includes a top surface leveled with top surfaces of the metal gate structures 130, 150 as shown in FIG. 1.

It is worth noting that, although the aforementioned embodiment is exemplified as a "gate-last" process and a "high-k first" process, the formation of the metal gates of the present invention may also be carried out in accordance with a "gate-first" process, a "high-k last" process or other gate forming process in other embodiments. Additionally, in one embodiment of the present invention, a contact etch stop layer (CESL, not shown in the drawings) for example including a monolayer structure or multilayer structure may be optionally formed on the substrate 100 before the interlayer dielectric material layer is formed to provide compressive stress or tensile stress to the metal gate structures 130, 150. Also, in another embodiment of the present invention, an epitaxial layer (not shown in the drawings) may be further formed at two sides of the metal gate structures 130, 150 in the fin shaped structures 101, 102 before the interlayer dielectric layer 170 is formed to provide preferable stress effect to the channels under the metal gate structures 130, 150.

Next, a sacrificial layer 200 and a mask layer 210 are sequentially formed to cover the entire substrate 100. The sacrificial layer 200 includes a material having an etching selectivity relative to the mask layer 210. The sacrificial layer 200 preferably includes silicon oxide and the mask layer 210 preferably includes a multilayer structure which is consisted of stacked material layers in different etching selectivity. In one embodiment, the mask layer 210 for example includes a quad-layer structure shown in FIG. 2, in which a first layer 211, a second layer 213, a third layer 215 and a fourth layer 217 stacked from bottom to top and having etching selectivity therebetween are formed. For example, the first layer 211 may include a material having etching selectivity relative to the second layer 213 and the sacrificial layer 200, and an example of the first layer 211 includes titanium nitride; the second layer 213 may include a material having etching selectivity relative to the first layer 211 and the third layer 215, and an example of the second layer 213 includes silicon nitride; the third layer 215 may include a material having etch-resistance and etching selectivity relative to the second layer 213 and the fourth layer 217, and an example of the third layer 215 includes carbide like silicon carbide; and the fourth layer 217 may include a material having etching selectivity relative to the third layer 215, and an example of the fourth layer 217 includes silicon oxynitride (SiON) or silicon carbon nitride (SiCN), but is not limited thereto. In another embodiment, the fourth layer 217 may also include same material as the second layer 213, such as SiN.

Figure 2:
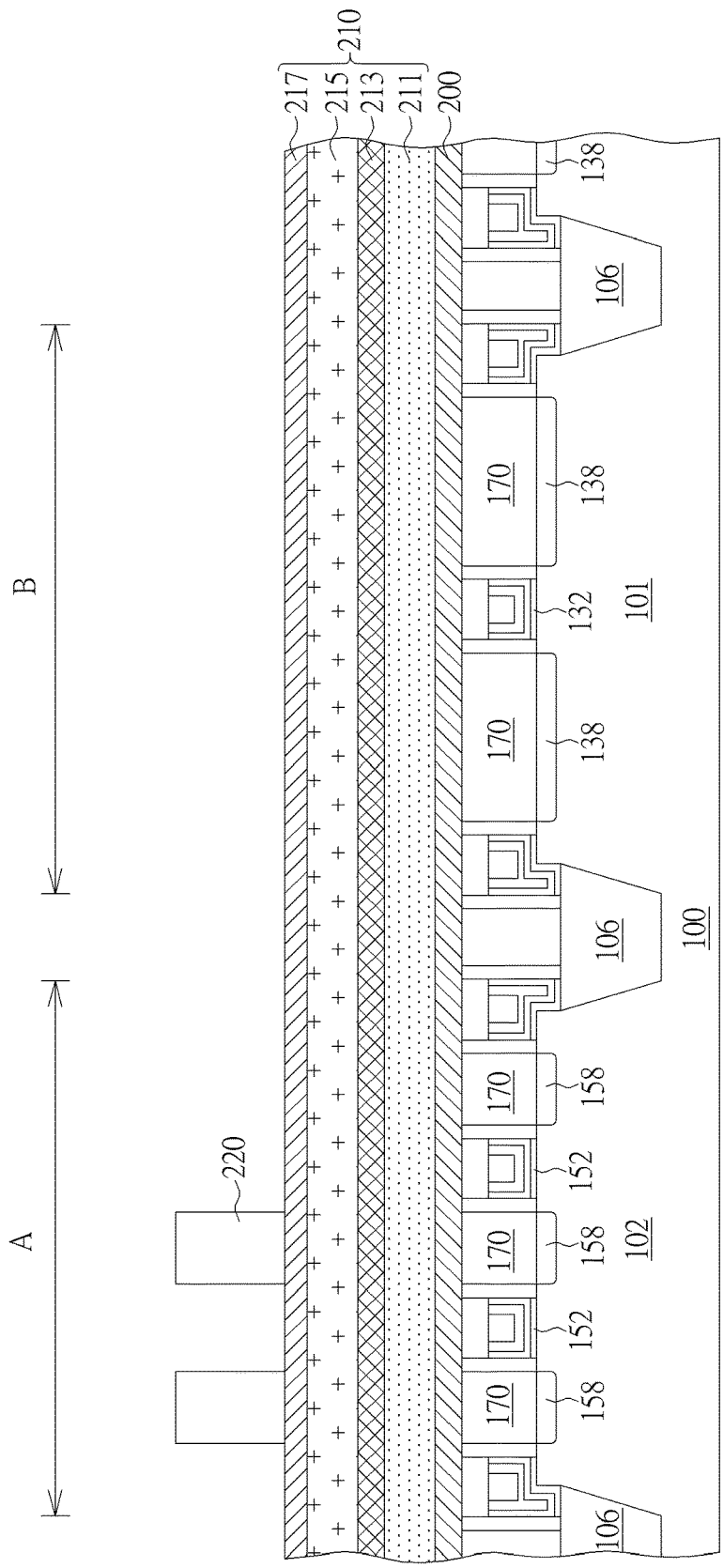

Next, a plurality of mandrels 220 is formed on the mask layer 210. It is noted that, the mandrels 220 are only formed within the dense region A as shown in FIG. 2. The formation of the mandrels 220 may be achieved by using a conventional semiconductor process. For example, a standard gate process may be performed to form a plurality of gate patterns configured to the mandrels 220, so that the mandrels 220 may include polysilicon or other suitable materials having etching selectivity relative to the mask layer 210 underneath such as silicon oxide. Precisely, each of the mandrels 220 is preferably spaced from each other to have a pitch (not shown in the drawings) being at least greater than a width of the mandrels 220 therebetween, but is not limited thereto. In one embodiment, an etching process may be optionally performed to remove a portion of each mandrel 220, thereby forming mandrels with a smaller width (not shown in the drawings).

Figure 3:
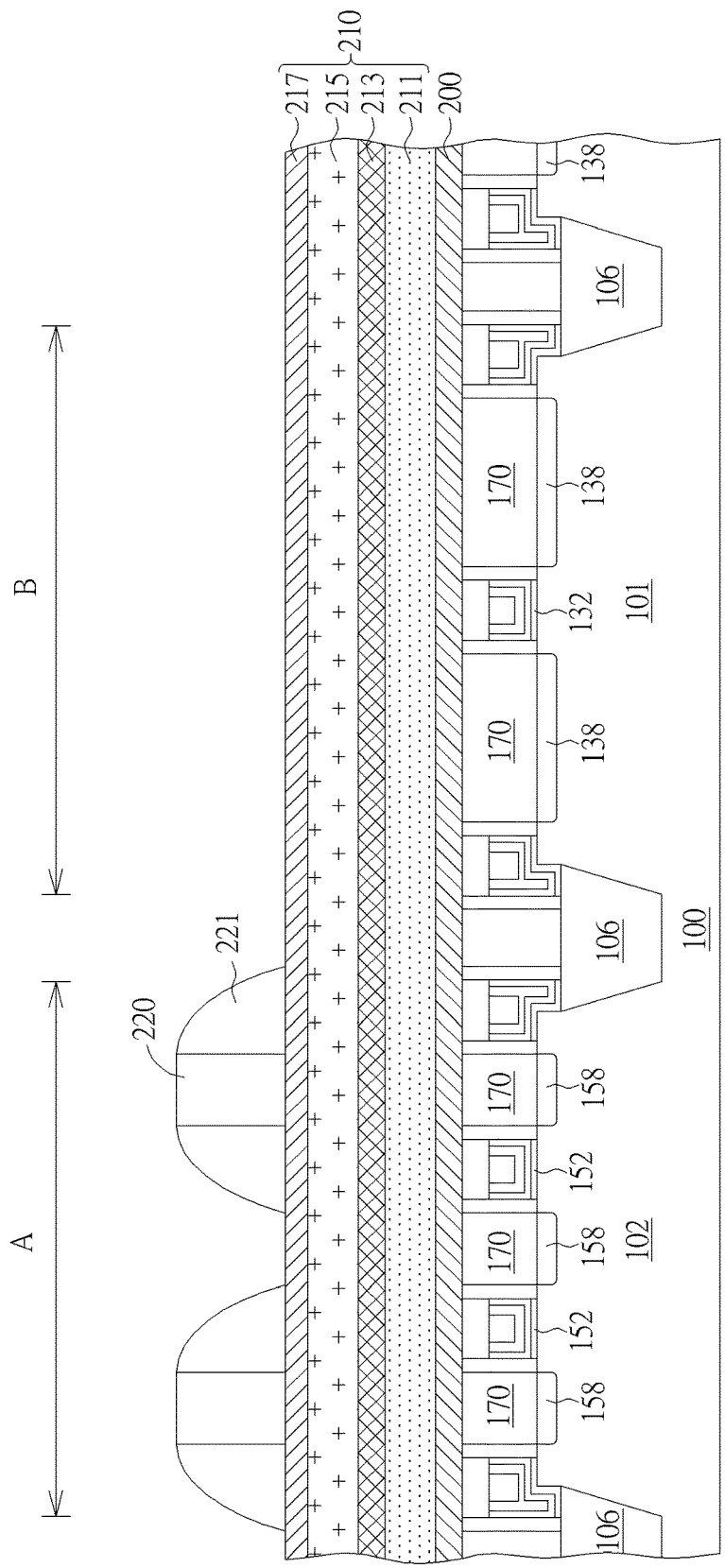

Next, a plurality of spacers 221 is formed to surround each mandrel 220. The formation of the spacers 221 may include firstly forming a spacer material layer (not shown in the drawings) on the substrate 100 to cover the mandrels 220 and performing an etching back process to remove the spacer material layer on top surfaces of the mask layer 210 and the mandrels 220 for forming the spacers 221 surrounding the mandrels 220 as shown in FIG. 3. Afterward, the mandrels 220 are completely removed.

Figure 4:
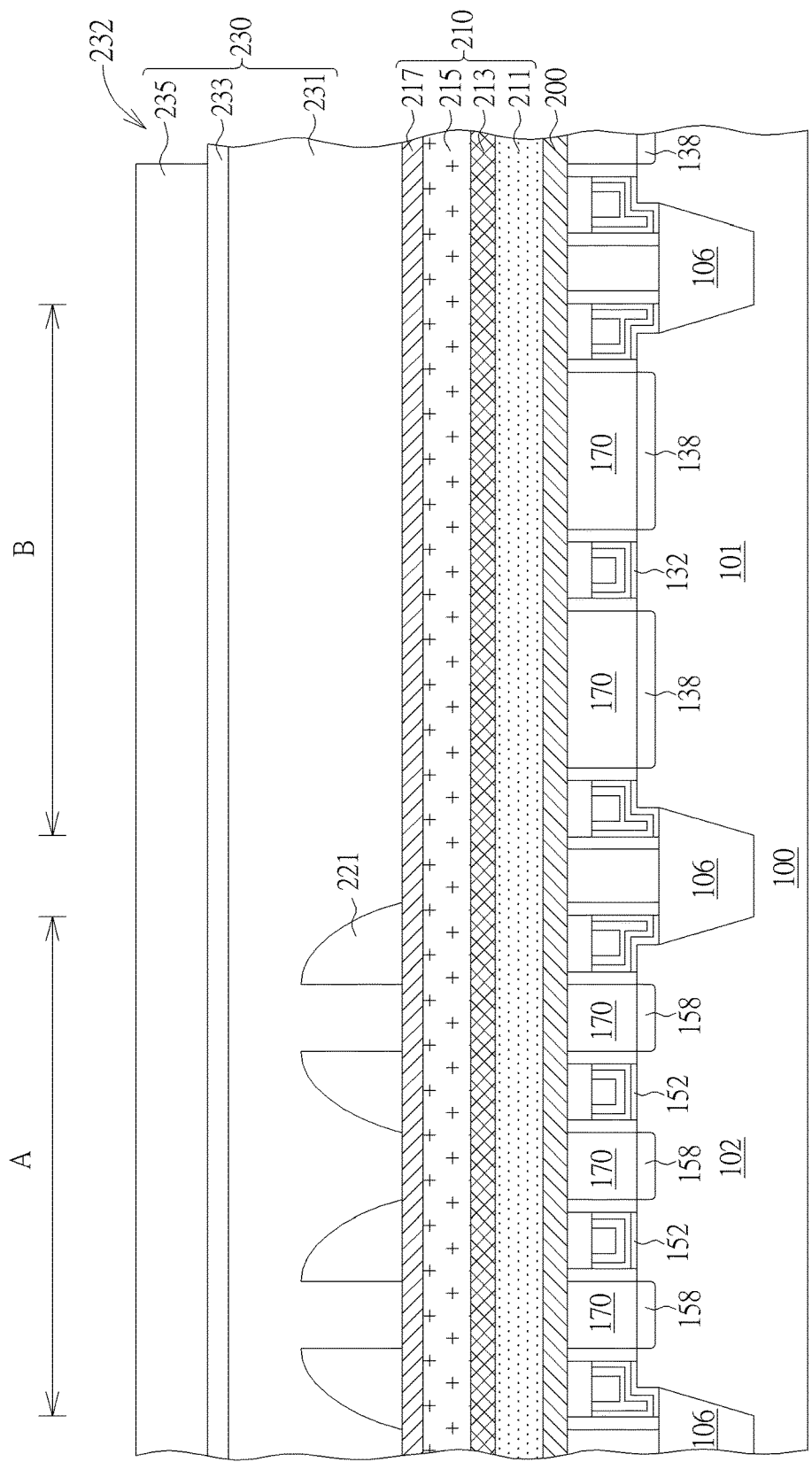

Subsequently, a patterned mask layer 230 is formed to cover the substrate 100 and the spacers 221. In one embodiment, the patterned mask layer 230 preferably includes a composite structure including a first mask layer 231 such as silicon oxide, a second mask layer 233 such as silicon nitride and a patterned photoresist layer 235, in which the patterned mask layer 230 (referring to the patterned photoresist layer 235 in particular) has an opening pattern 232 as shown in FIG. 4.

Figure 5:
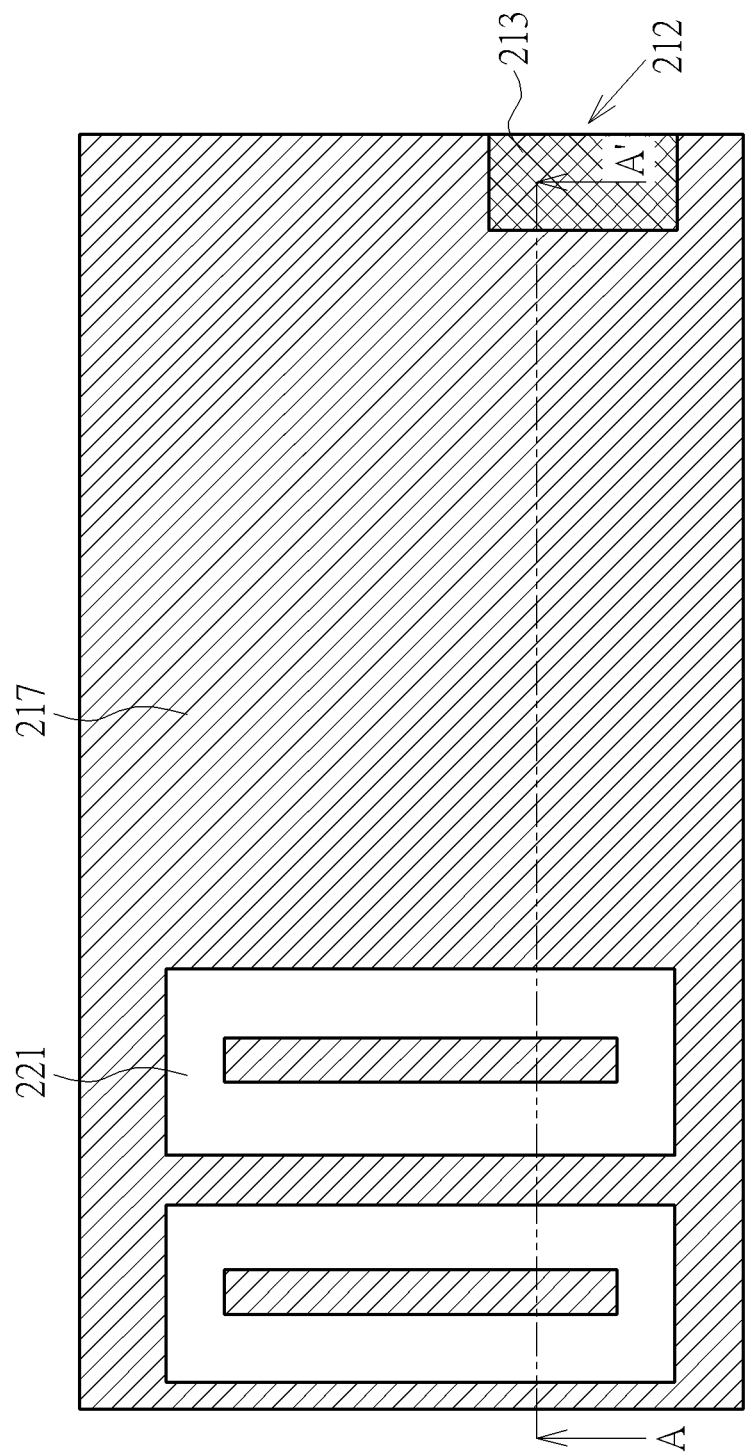
Figure 6:
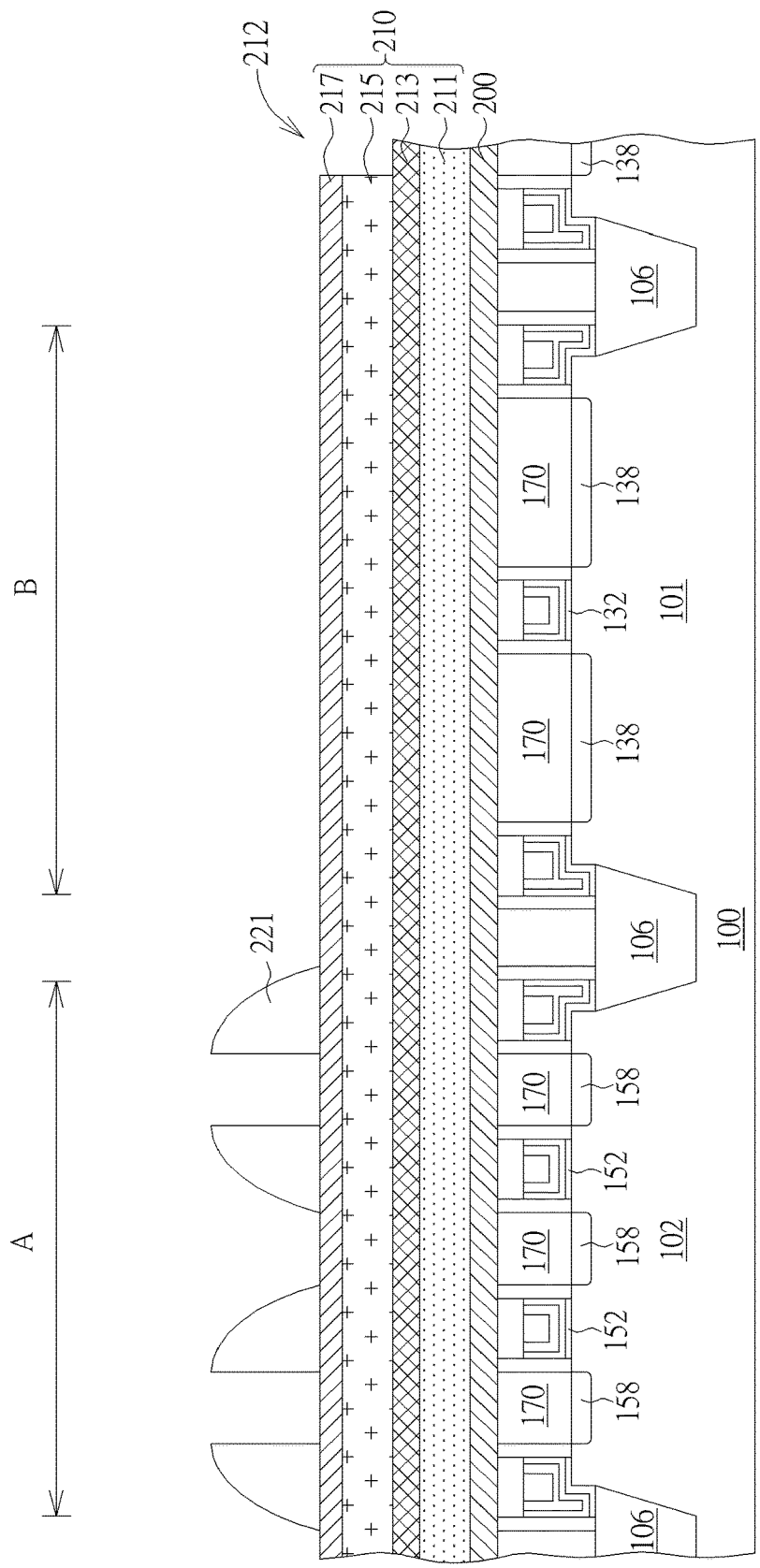

Next, an etching process such as a dry etching, a wet etching or a sequentially performed dry and wet etching process is carried out by using the patterned mask layer 230 as a mask to transfer the opening pattern 232 of the patterned mask layer 230 into the mask layer 210 underneath. This forms an opening pattern 212 in the mask layer 210 to define the location of a partial plug structure in the iso region B as shown in FIGS. 5-6. Afterward, the patterned mask layer 230 is completely removed. It is noted that the opening pattern 212 only forms in the fourth layer 217 and the third layer 215 of the mask layer 210 in the present embodiment as shown in FIG. 6, but is not limited thereto.

Figure 7:
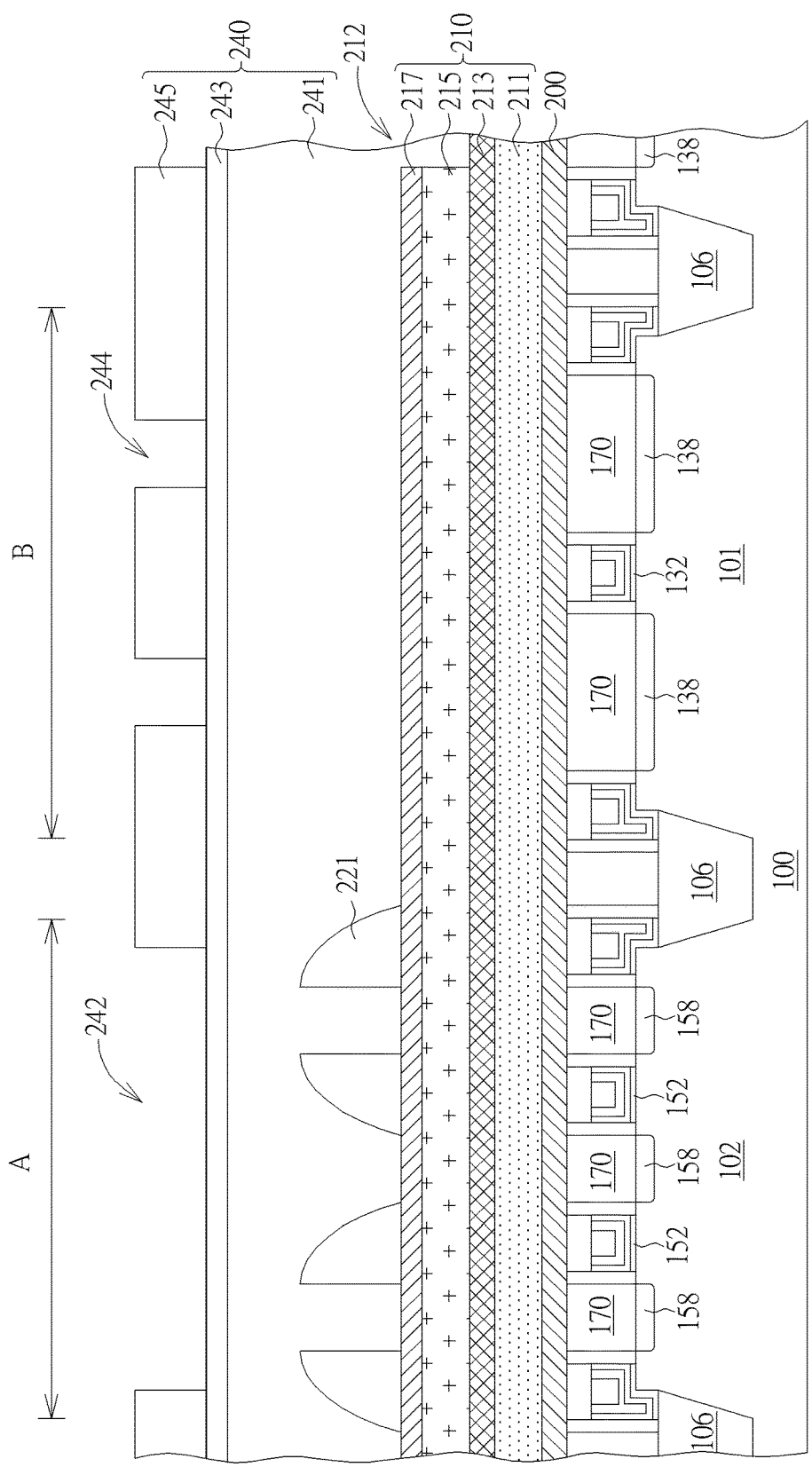

Another patterned mask layer 240 is then formed on the substrate 100 and the spacers 221. In one embodiment, the patterned mask layer 240 preferably includes a composite structure including a third mask layer 241 such as silicon oxide, a fourth mask layer 243 such as silicon nitride and a patterned photoresist layer 245, in which the third mask layer 241 is filled in the opening pattern 212. Specifically, the patterned mask layer 240 (referring to the patterned photoresist layer 245 in particular) includes opening patterns 242, 244 in the dense region A and the iso region B respectively. It is noted that the opening pattern 242 in the dense region A is formed in alignment with the spacers 221 disposed underneath to correspond to the active area of the dense region A and the opening pattern 244 is configured to define a partial plug structure in the iso region B as shown in FIG. 7.

Figure 8:
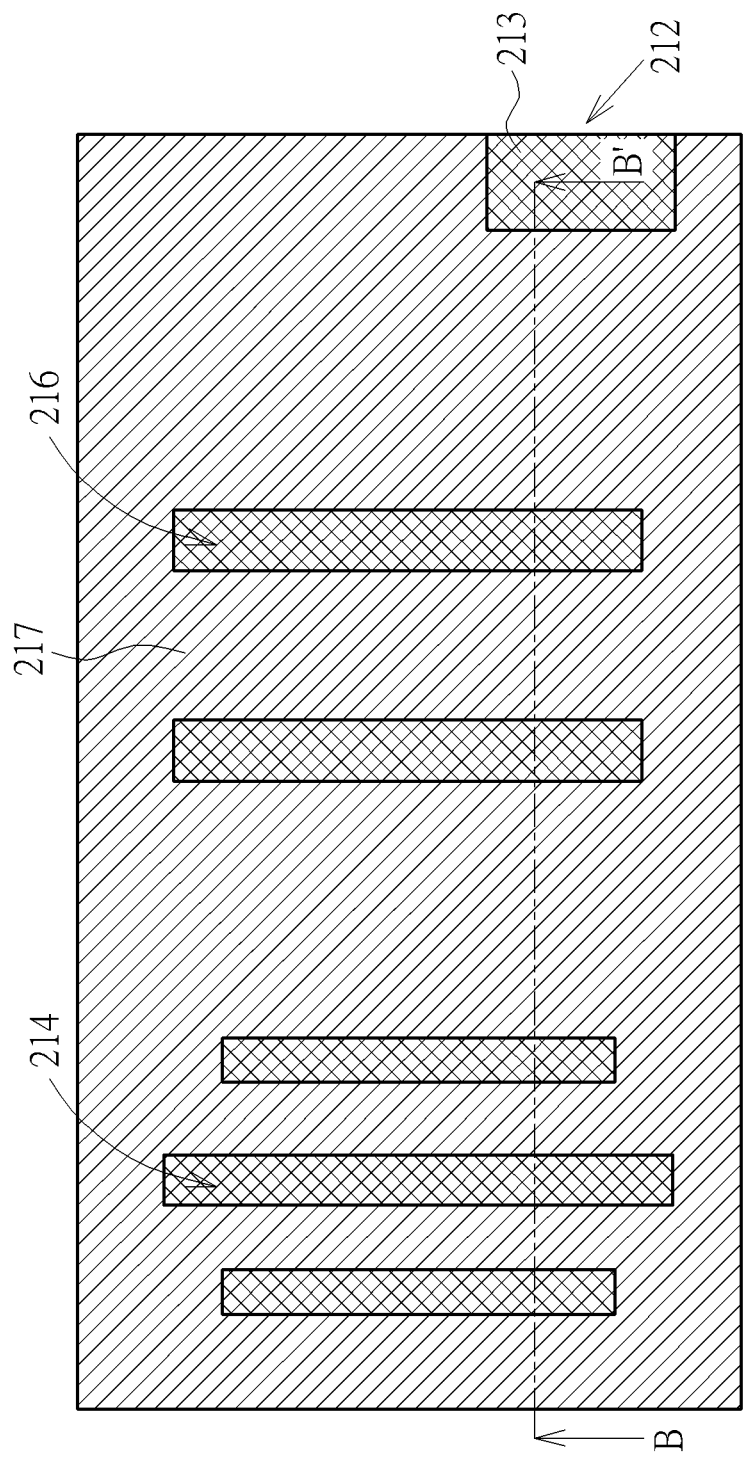
Figure 9:
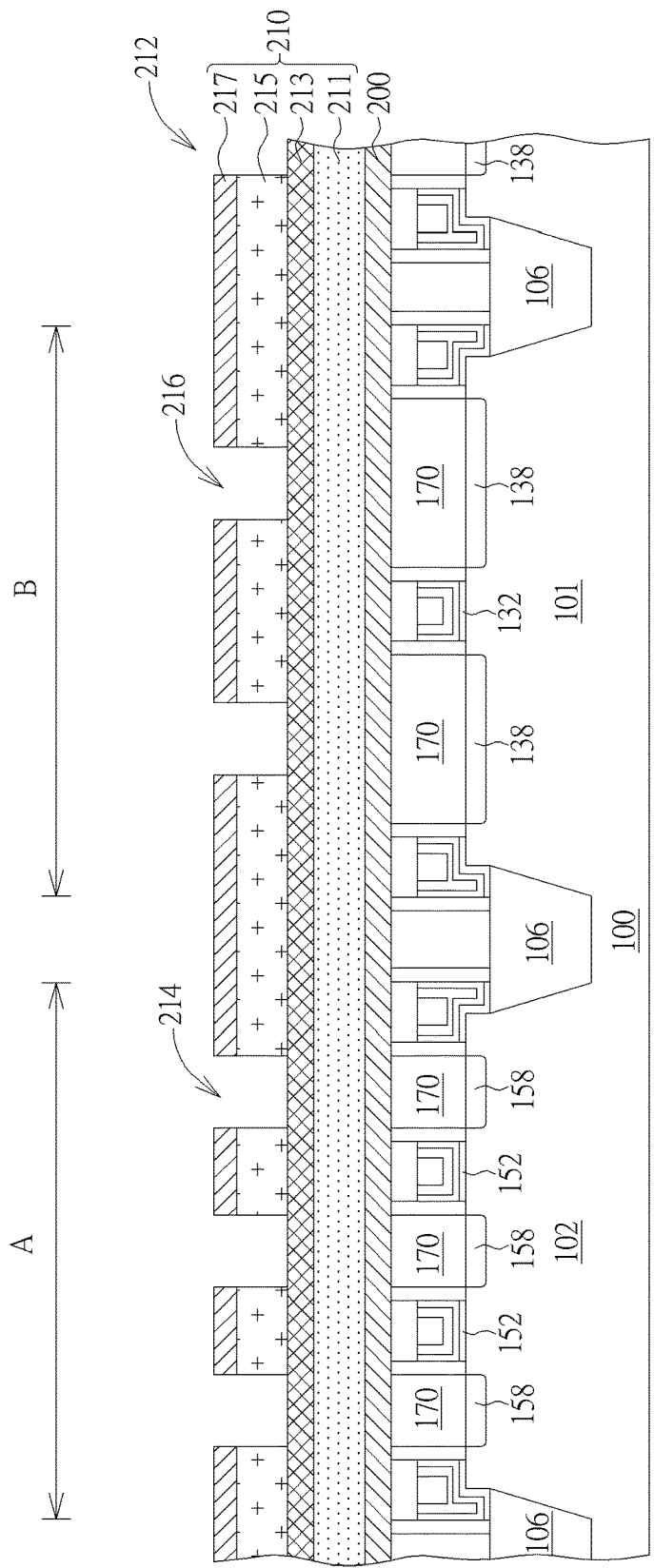

Next, another etching process such as a dry etching, a wet etching or a sequentially performed dry and wet etching process is carried out by using the patterned mask layer 240 as a mask to transfer the opening patterns 242, 244 of the patterned mask layer 240 into the mask layer 210 underneath. This forms opening patterns 214, 216 in the mask layer 210 in the dense region A and the iso region B respectively as shown in FIGS. 8-9. Afterward, the patterned mask layer 240 and the spacers 221 are completely removed. It is noted that the spacers 221 still remain on the mask layer 210 in the dense region A while the etching process is performed, so that the patterns of the spacers 221 and the opening pattern 242 may be transferred simultaneously into the mask layer 210 underneath for forming three opening patterns 214 in the dense region A. The three opening patterns 214 are namely formed in positions corresponding to two mandrels 220 and a gap between the two mandrels 220 respectively for defining the location of plug structures in the dense region A. Also, in the present embodiment, the opening patterns 214, 216 are only formed in the fourth layer 217 and the third layer 215 of the mask layer 210 as shown in FIG. 9, but not limited thereto.

Figure 10:
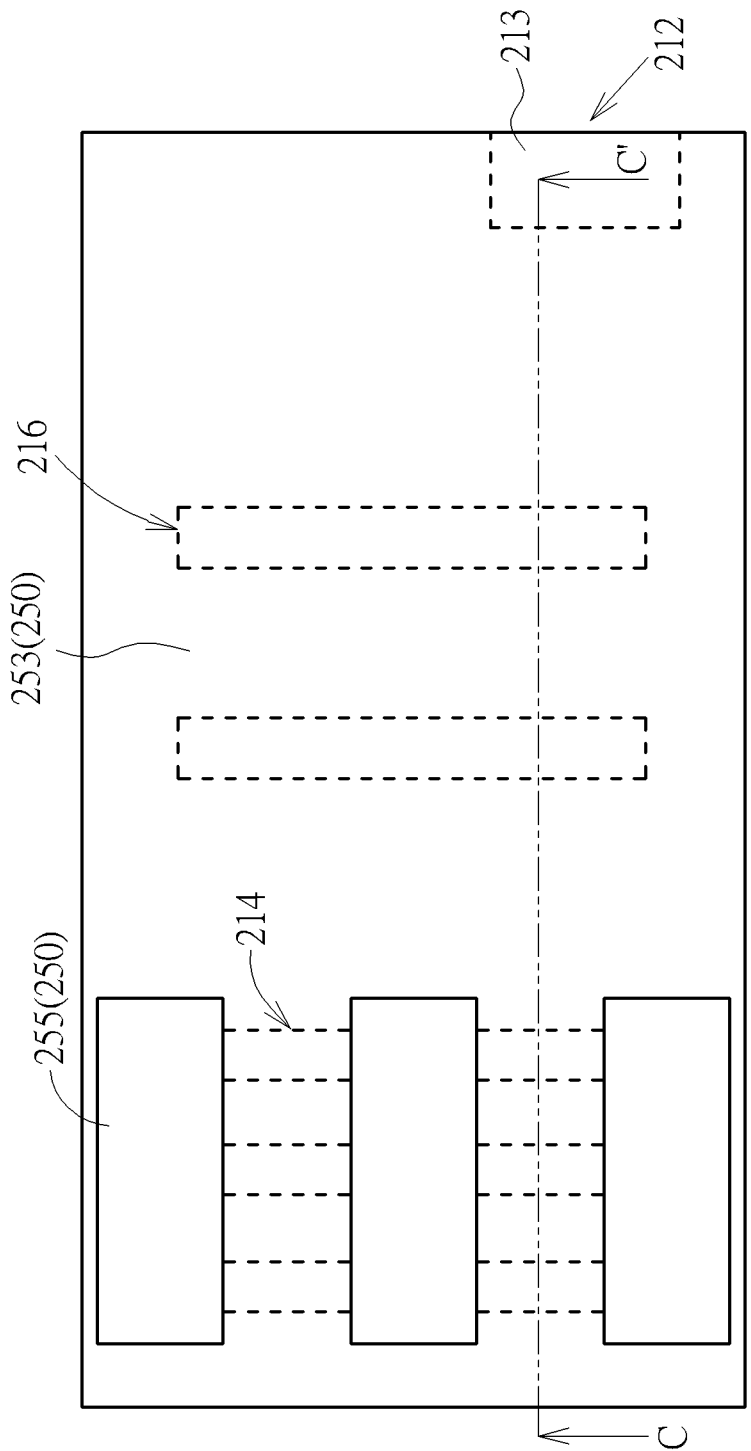
Figure 11:
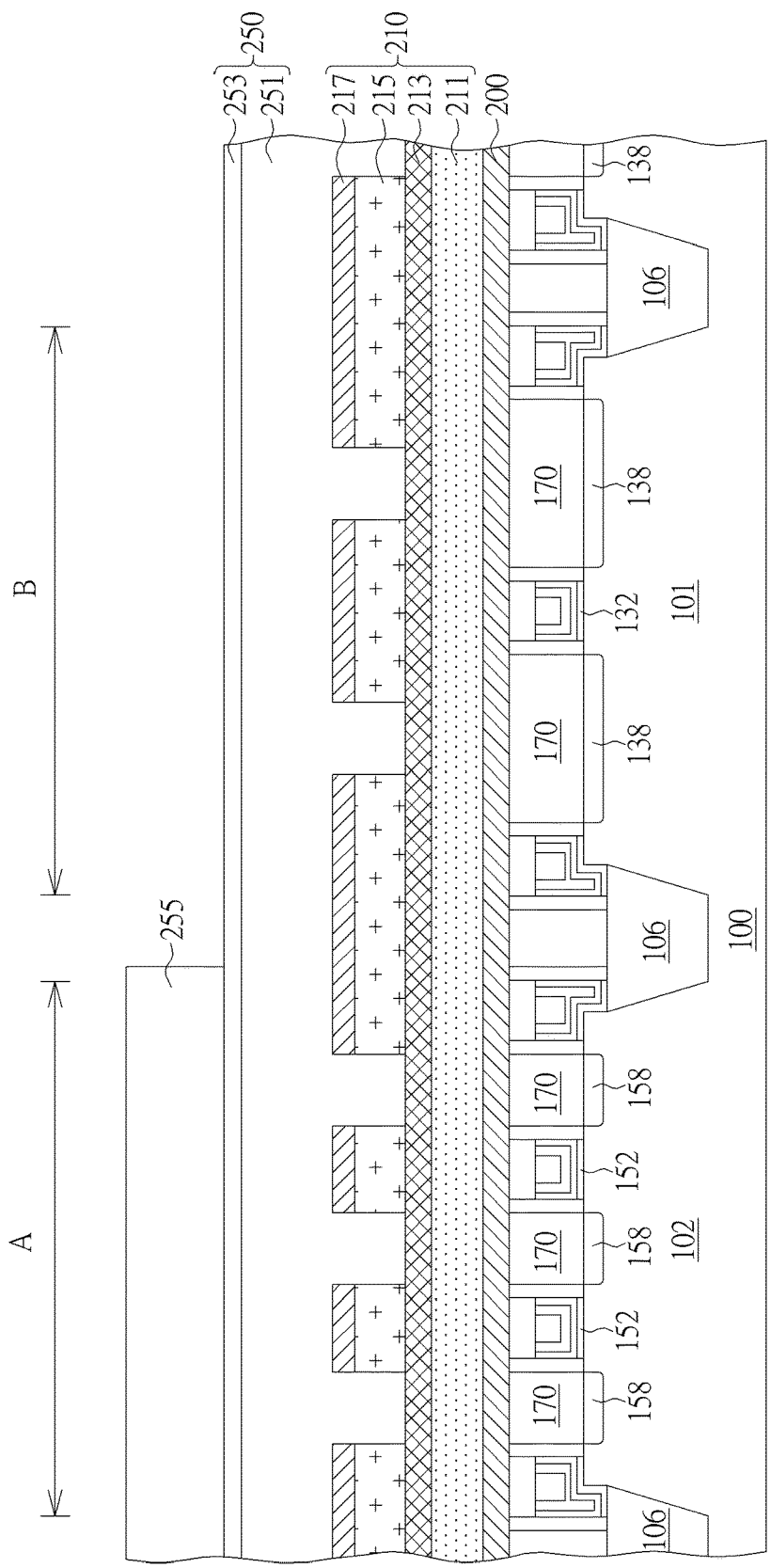

Next, a blocking layer 250 is formed to cover at least a portion of the opening patterns 214 such as the head portion, the end portion and the middle portion of the opening pattern 214 as shown in FIGS. 10-11. In one embodiment, the blocking layer 250 preferably includes a composite structure including a first blocking layer 251 such as silicon oxide, a second blocking layer 253 such as silicon nitride and a patterned photoresist layer 255, in which the first blocking layer 251 is filled in the opening patterns 212, 214, 216 as shown in FIG. 11. Then, another etching process is carried out to further transfer the opening patterns 212, 214, 216 formed in the fourth layer 217 and the third layer 215 into the second layer 213 and the first layer 211 of the mask layer 210 for forming opening patterns 212a, 214a, 216a. Afterward, the blocking layer 250 is completely removed.

Figure 12:
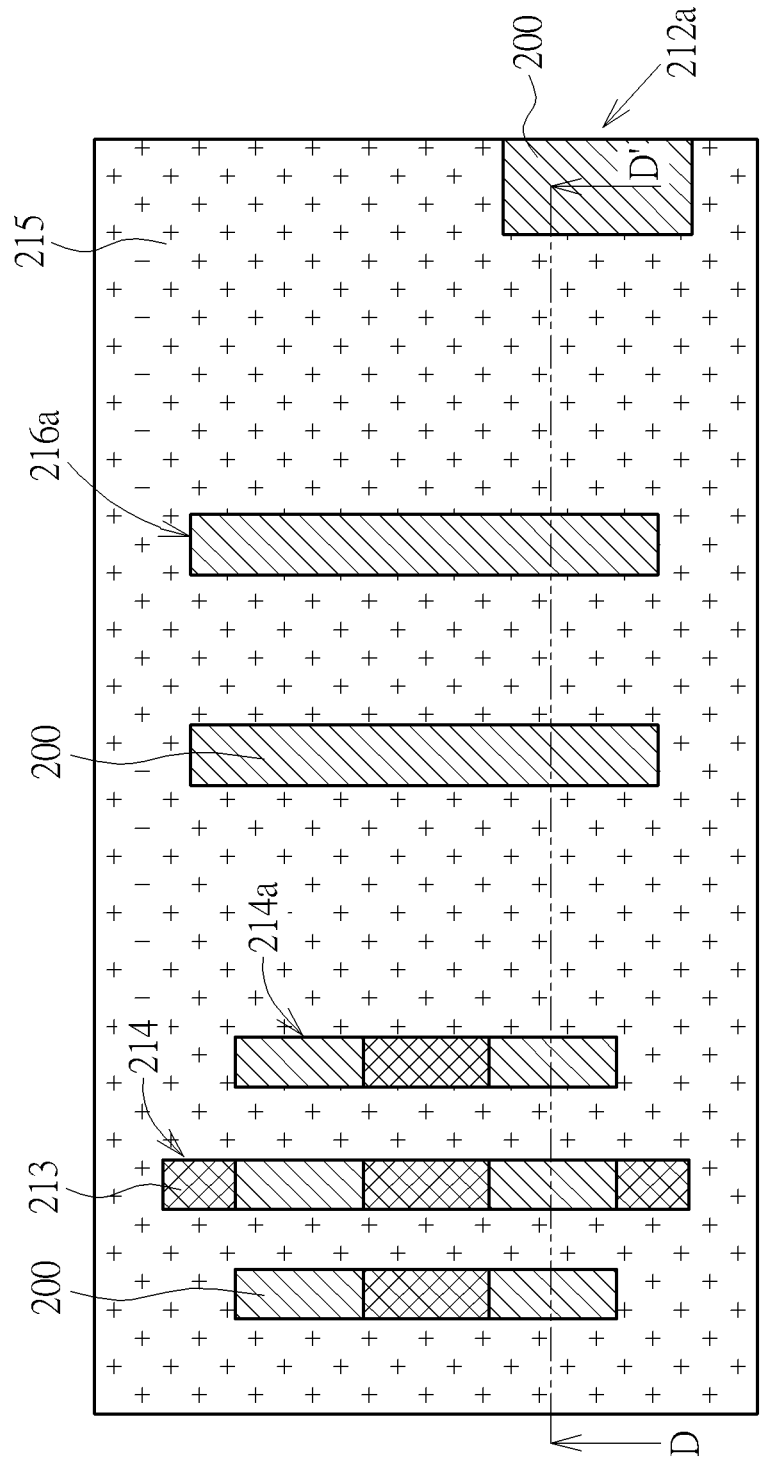
Figure 13:
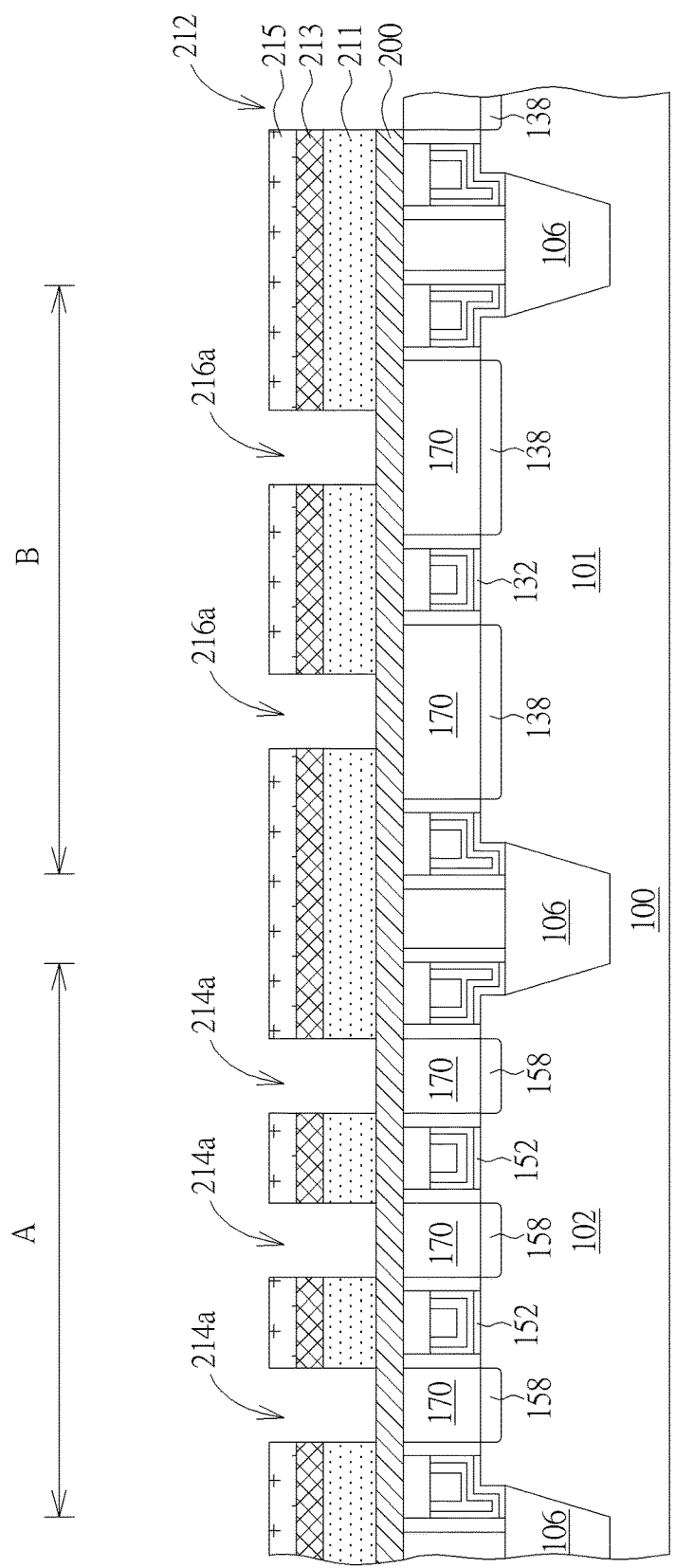

It is worth mentioning that part of the opening patterns 214 are blocked while the etching process is performed, so that only the uncovered portion of the opening patterns 214 and the opening pattern 216 may be transferred into the second layer 213 and the first layer 211 underneath to form six opening patterns 214a and two opening patterns 216a as shown in FIGS. 12-13. On the other hand, the pattern of the covered portion of the opening patterns 214 may remain in the fourth layer 217 and the third layer 215 as shown in FIG. 12. Then, the fourth layer 217 and the third layer 215 may be sequentially removed after the etching process.

Figure 14:
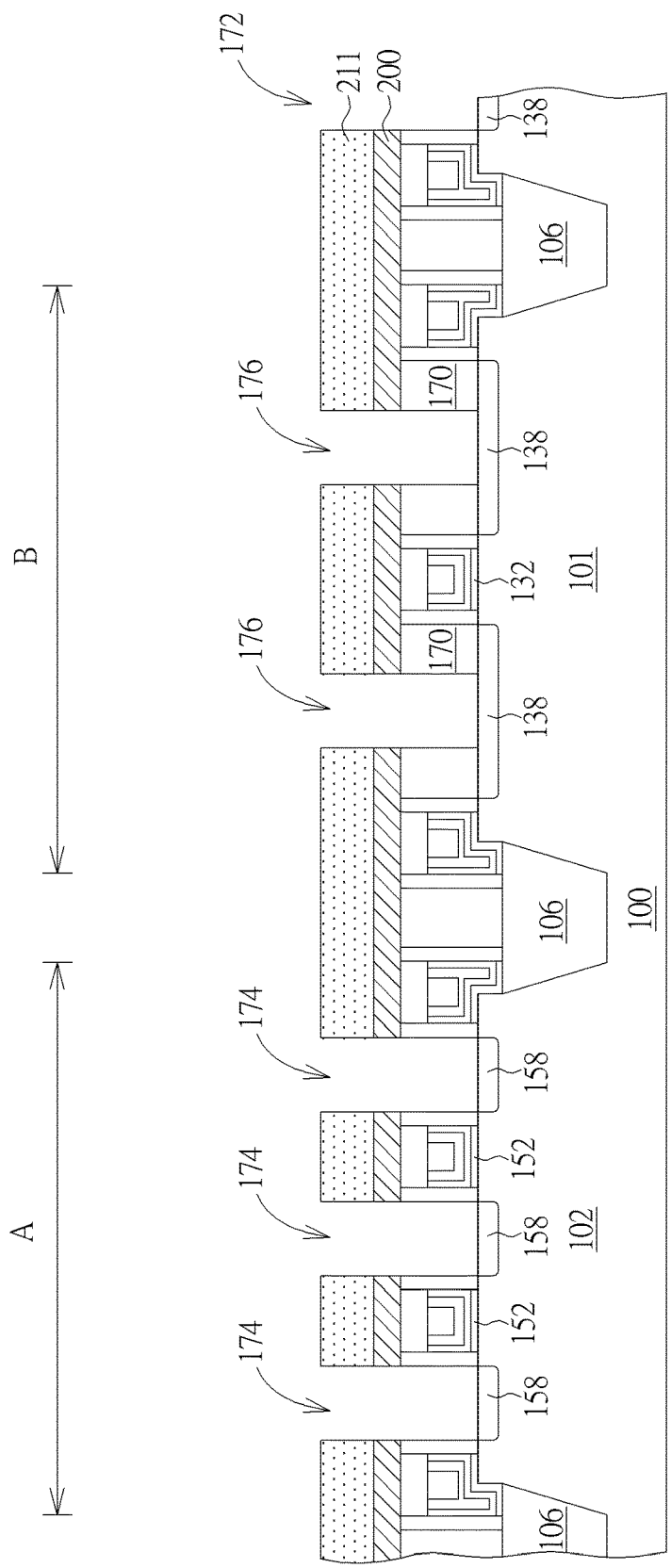

Next, another etching process is performed by using the second layer 213 and the first layer 211 as a mask to continuously transfer the opening patterns 212a, 214a, 216a into the sacrificial layer 200 and the interlayer dielectric layer 170. This forms openings 174, 176 connecting to the source/drain regions 158, 138 in the dense region A and the iso region B respectively as shown in FIG. 14. It is noted that the pitch P1 between each metal gate structure 150 in the dense region A is relative smaller than that of the pitch P2 of the metal gate structure 130 in the iso region B, so that the openings 174 connected to the source/drain regions 158 preferably have relatively smaller diameter. As a result, the dielectric layer 170 is not exposed from the openings 174 but instead of the entire sidewall (or the spacer 153 in particular) of the metal gate structure 150 is exposed from the openings 174 as shown in FIG. 14. On the other hand, since the pitch P2 of the metal gate structures 130 is relatively greater, each openings 176 connected to the source/drain regions 138 also have greater diameter. As a result, only the interlayer dielectric layer 170 is exposed from the openings 176 instead of the sidewalls of the metal gate structure 130 as shown in FIG. 14.

Figure 15:
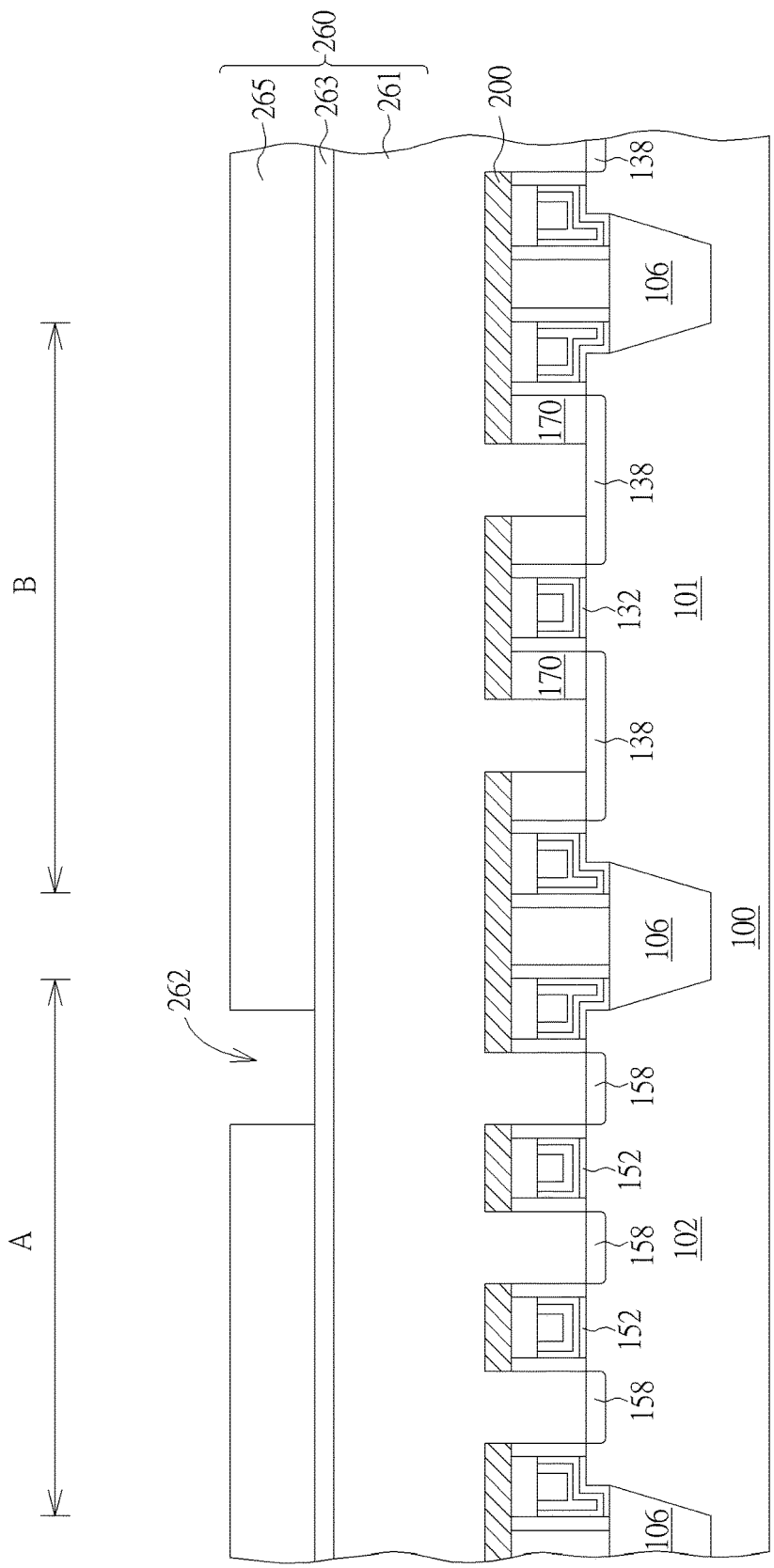
Figure 16:
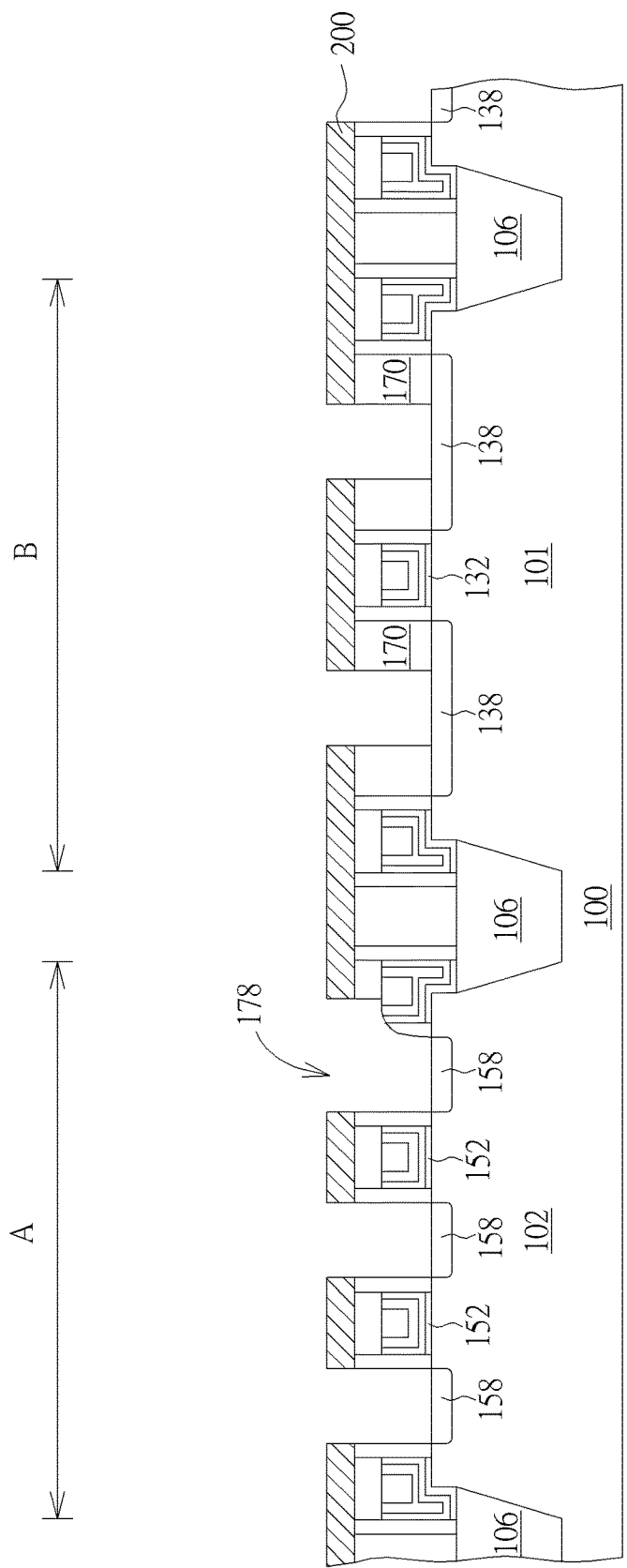

Following these, a plug forming process may be performed to form plug structures in the openings 172, 174, 176 or an additional opening forming process shown in FIGS. 15-16 may be further performed to form a gate plug structure. Specifically, the formation of the gate plug structure may be accomplished by first forming a patterned mask layer 260 to cover the entire substrate 100. In one embodiment, the patterned mask layer 260 preferably includes a composite structure for example including a fifth mask layer 261 such as silicon oxide, a sixth mask layer 263 such as silicon nitride and a patterned photoresist layer 265 stacked on each other, in which the fifth mask layer 261 is filled in the openings 172, 174, 176 and the patterned mask layer 260 (the patterned photoresist layer 265 in particular) includes an opening patterns 262 as shown in FIG. 15.

Next, another etching process such as a dry etching, a wet etching or a sequentially performed dry and wet etching process is carried out by using the patterned mask layer 260 as a mask to transfer the opening pattern 262 of the patterned mask layer 260 into the sacrificial layer 200 and the interlayer dielectric layer 170 underneath for forming an opening 178 as shown in FIG. 16. Afterward, the patterned mask layer 260 is completely removed. It is to be noted that the opening 178 overlaps and connects to one of the openings 174 as shown in FIG. 16 so that a plug structure may be formed in the opening 178 to electrically connect to another metal gate structure (not shown in the drawings).

Finally, a silicidation and plug forming process are carried out sequentially to form silicide layers 272, 274, 276, 278 on surfaces of the source/drain regions 138, 158 exposed from the openings 172, 174, 176, 178 and to form contact plugs 282, 284, 286, 288 in the openings 172, 174, 176, 178. Specifically, the silicidation process of the present embodiment includes conformally forming a metal layer (not shown in the drawings) in the openings 172, 174, 176, 178, in which the metal layer includes metal selected from the group consisting of titanium, cobalt (Co), nickel (Ni) and platinum (Pt), and most preferably titanium, but is not limited thereto. Then, an annealing process for example including a soak annealing process and/or a spike annealing process is performed to react the metal layer with the exposed source/drain regions 138, 158 to form silicide layers 272, 274, 276, 278 composed of titanium silicide (TiSi). Thereafter, the unreacted metal layer is removed and plug forming process is carried out. It is noted that the contact plugs 282, 284, 286, 288 are filled in the openings 172, 174, 176, 178 to electrically connect the source/drain regions 138, 158 through the silicide layers 272, 274, 276, 278.

Figure 17:
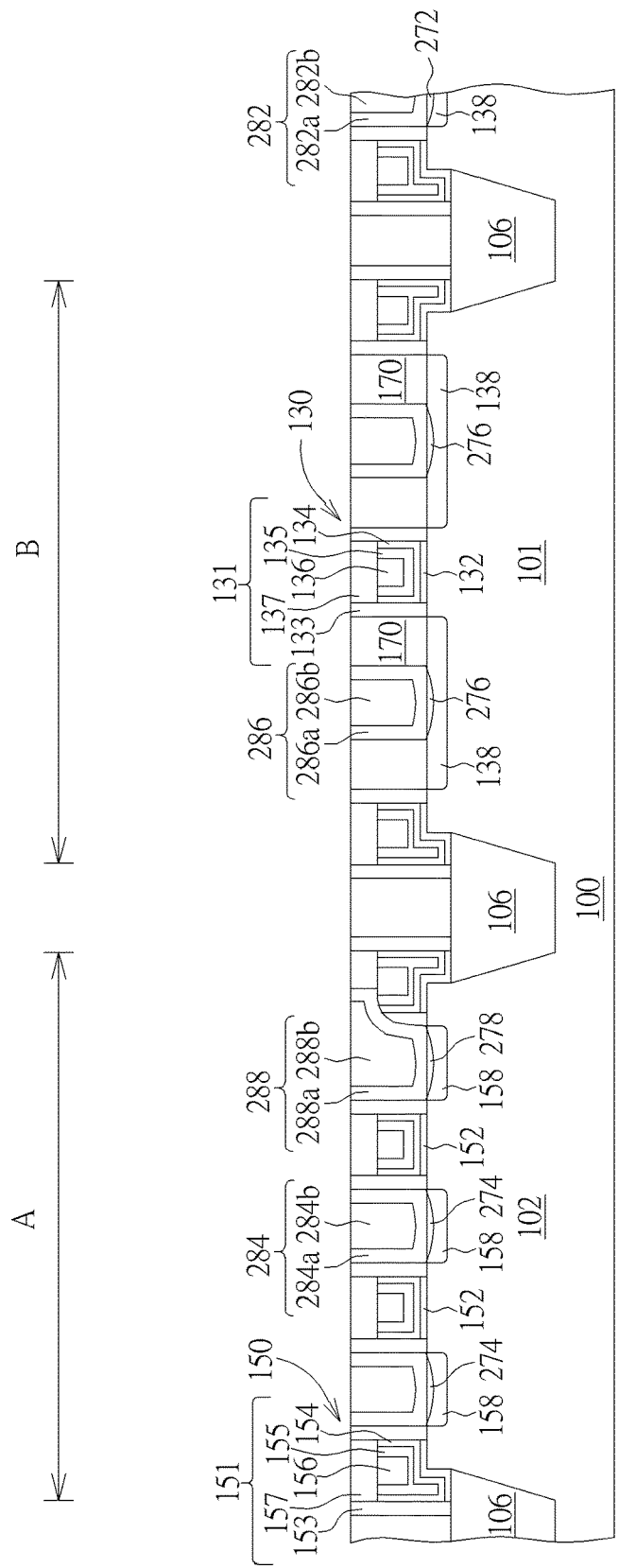

Preferably, the plug forming processing is accomplished by sequentially forming a barrier material layer (not shown in the drawings) and a metal material layer (not shown in the drawings) in the openings 172, 174, 176, 178, and removing a portion of the metal material layer and a portion of the barrier material layer through a planarization process such as a CMP process, an etching process or a combination of both to form the contact plugs 282, 284, 286, 288. Preferably, the contact plugs 282, 284, 286, 288 include barrier layers 282a, 284a, 286a, 288a and contact metal layers 282b, 284b, 286b, 288b. Then, the sacrificial layer 200 could be removed completely. In one embodiment, each of the barrier layers 282a, 284a, 286a, 288a may include a titanium layer, a titanium nitride layer, a tantalum layer or a tantalum nitride layer and the contact metal layer 282b, 284b, 286b, 288b may include tungsten or metal having low resistance, but not limited thereto. It should be noted that each of the contact plugs 282, 284, 286, 288 is leveled with a top surface of the interlayer dielectric layer 170 and the contact plugs 284, 288 directly contact the sidewalls (or the spacer 153 in particular) of the metal gate structure 150 but does not contact the interlayer dielectric layer 170. The contact plugs 282, 286 on the other hand only contact the interlayer dielectric layer 170 so that the interlayer dielectric layer 170 is disposed to surround the contact plugs 282, 286 but not contacting the sidewalls of the metal gate structures 130 directly as shown in FIG. 17.

Through the above-mentioned steps, the semiconductor device according to the preferred embodiment of the present invention is obtained. In the method of the present invention, the spacer self-aligned double patterning process and a patterned mask layer are used to transfer the opening patterns formed in the dense region and the iso region, thereby forming openings connected to source/drain regions in the dense region and the iso region respectively. In this manner, the present invention is able to form precise layout of the fin shaped structures and to improve the electrical performance of the entire device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A method of forming a semiconductor device, comprising:
  providing a substrate having a first fin shaped structure in a first region and a second fin shaped structure in a second region;
  forming a first gate structure across the first fin shaped structure, and a second gate structure across the second fin shaped structure;

forming a dielectric layer on the substrate to cover the first gate structure and the second gate structure and the substrate;

forming a mask layer on the dielectric layer, the first gate structure and the second gate structure, wherein the mask comprises a quad-layer structure and the quad-layer structure comprises materials in different etching selectivity alternately stacked one over another;

forming a first pattern in the mask layer in the first region through a sidewall image transferring process;

forming a patterned hard mask layer on the mask layer, in the second region;

using the patterned hard mask layer to form a second pattern in the mask layer in the second region;

removing a portion of the dielectric layer in the first region by using the first pattern as a mask, to form a first opening exposing sidewalls of the first gate structure; and removing a portion of the dielectric layer in the second region by using the second pattern as a mask, to form a second opening.

2. The method of forming a semiconductor device according to claim 1, wherein the mask layer comprises a first layer, a second layer, a third layer and a fourth layer, and the first pattern and the second pattern are formed on the first layer and the second layer.

3. The method of forming a semiconductor device according to claim 2, wherein the second layer and the fourth layer comprise nitrides.

4. The method of forming a semiconductor device according to claim 2, wherein the first layer and the third layer comprise metal and carbides respectively.

5. The method of forming a semiconductor device according to claim 1, wherein the forming of the first pattern comprises:

forming a plurality of mandrels on the mask layer;

forming a plurality of spacers surrounding the mandrels; and forming the first pattern by using the spacers as a mask.

6. The method of forming a semiconductor device according to claim 5, wherein the mandrels have different etching selectivity relative to the materials of the mask layer.

7. The method of forming a semiconductor device according to claim 1, wherein the first opening and the second opening are formed simultaneously.

8. The method of forming a semiconductor device according to claim 1, further comprising:

forming a sacrificial layer between the dielectric layer and the mask layer.

9. The method of forming a semiconductor device according to claim 1, wherein the first gate structure further comprises a first spacer, the method further comprises:

forming a first plug in the first opening and the first plug contacting sidewalls of the first spacer; and forming a second plug in the second opening.

10. The method of forming a semiconductor device according to claim 9, wherein the first plug and the second plug are electrically connected to two source/drain regions disposed at two sides of the first gate structure and the second gate structure respectively.

11. The method of forming a semiconductor device according to claim 9, wherein the second plug is surrounded by the dielectric layer.

12. The method of forming a semiconductor device according to claim 1, further comprising:

forming a plurality of shallow trench isolations surrounding the first fin shaped structure and the second fin shaped structure.

* * * * *